(12) United States Patent
Mori

(10) Patent No.: US 12,400,695 B2
(45) Date of Patent: Aug. 26, 2025

(54) SEMICONDUCTOR MEMORY WITH ADJUSTMENT CIRCUIT AND METHOD FOR CONTROLLING A SEMICONDUCTOR MEMORY

(71) Applicant: Winbond Electronics Corp., Taichung (TW)

(72) Inventor: Kaoru Mori, Yokohama (JP)

(73) Assignee: WINBOND ELECTRONICS CORP., Taichung (TW)

( * ) Notice: Subject to any disclaimer, the term of this patent is extended or adjusted under 35 U.S.C. 154(b) by 288 days.

(21) Appl. No.: 18/192,294

(22) Filed: Mar. 29, 2023

(65) Prior Publication Data

US 2023/0377622 A1    Nov. 23, 2023

(30) Foreign Application Priority Data

May 18, 2022    (JP) .................. 2022-081234

(51) Int. Cl.
| | |
|---|---|
| *G11C 8/00* | (2006.01) |
| *G11C 7/10* | (2006.01) |
| *G11C 7/22* | (2006.01) |

(52) U.S. Cl.
CPC ............ *G11C 7/222* (2013.01); *G11C 7/1063* (2013.01); *G11C 7/1069* (2013.01)

(58) Field of Classification Search
CPC ..... G11C 7/222; G11C 7/1063; G11C 7/1069; G11C 7/106; G11C 11/4093; G11C 2207/2272; G11C 7/1066
USPC ...................................................... 365/233.1
See application file for complete search history.

(56) References Cited

U.S. PATENT DOCUMENTS

| | | | |
|---|---|---|---|
| 6,973,001 B1 * | 12/2005 | Tomita ................... | G11C 7/222 365/194 |
| 7,203,113 B2 | 4/2007 | Takahashi et al. | |
| 7,548,471 B2 | 6/2009 | Loeffler et al. | |
| 7,675,773 B2 * | 3/2010 | Mori ................... | G11C 29/1201 365/230.06 |
| 9,036,448 B2 * | 5/2015 | Nagata .................... | G11C 8/18 365/233.11 |
| 9,536,625 B1 | 1/2017 | Quinton et al. | |

(Continued)

FOREIGN PATENT DOCUMENTS

| | | |
|---|---|---|
| CN | 108052479 A | 5/2018 |
| JP | 2012-44414 A | 3/2012 |
| TW | 571430 B | 1/2004 |

(Continued)

*Primary Examiner* — Tha-O H Bui
(74) *Attorney, Agent, or Firm* — Birch, Stewart, Kolasch & Birch, LLP

(57) ABSTRACT

A semiconductor memory is provided to include an adjustment circuit. The adjustment circuit sets a second period longer than a first period and adjusts time at which the last read data is output. When a chip selection signal is set to be asserted, the semiconductor memory device performs a read operation on data according to an external clock signal. The first period begins at a rising edge or a falling edge of the external clock signal and ends when the output of the last read data begins. The second period begins when the chip selection signal goes from asserted to negated and ends when the output of the last read data is complete. The external clock signal is used to read the last read data during the read operation.

16 Claims, 8 Drawing Sheets

(56) References Cited

U.S. PATENT DOCUMENTS

2006/0215467 A1     9/2006   Partsch
2018/0293025 A1*   10/2018   Sakai .................... G06F 3/0659

FOREIGN PATENT DOCUMENTS

TW     200541216 A     12/2005
TW     201618115 A      5/2016
TW     202203047 A      1/2022

* cited by examiner

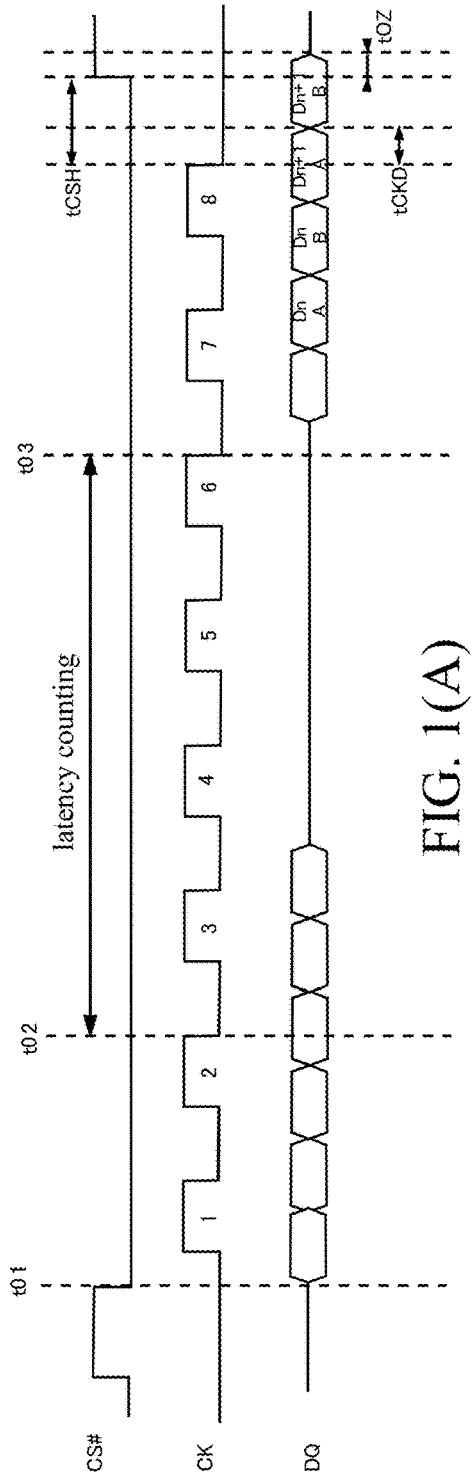
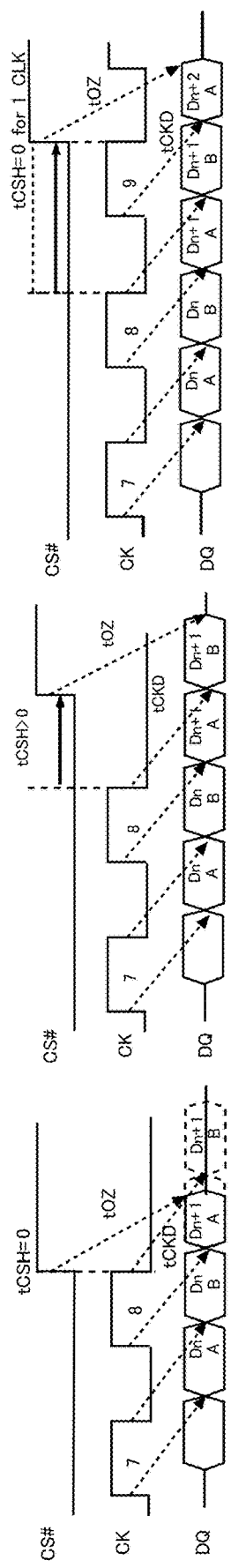
FIG. 1(A) (RELATED ART)
FIG. 1(B) (RELATED ART)
FIG. 1(C) (RELATED ART)
FIG. 1(D) (RELATED ART)

SEMICONDUCTOR MEMORY WITH ADJUSTMENT CIRCUIT AND METHOD FOR CONTROLLING A SEMICONDUCTOR MEMORY

CROSS REFERENCE TO RELATED APPLICATIONS

This application claims priority of Japan Patent Application No. 2022-081234, filed on May 18, 2022, the entirety of which is incorporated by reference herein.

BACKGROUND OF THE INVENTION

Field of the Invention

The present invention relates to a semiconductor memory device and a method for controlling the same.

Description of the Related Art

FIGS. 1(A)-(D) are timing charts illustrating a read operation of a pSRAM. FIG. 1(A) is a timing chart illustrating the entire read operation. FIG. 1(B)~FIG. 1(D) are timing charts illustrating the end of the read operation in detail. In this pSRAM, a double data rate (DDR) is used for data transmission, and the read operation is performed when a chip selection signal CS # is set asserted (low level). A data signal DQ has a predetermined length (for example, 16 bits) and includes commands, addresses (a column address, a row address), and read data. The data signal DQ is input or output according to an external clock signal CK.

In the example shown in FIGS. 1(A)-1(D), when the chip selection signal CS # changes from negation (high level) to assertion at the time t01, the data signal DQ including commands, a column address, and a row address is input during the first to third clock pulses of the clock signal CK. In addition, the latency counting begins from the time t02 after the time t01. The output data is read at the rising edge of the next external clock pulse (the seventh clock pulse in the figures) after the latency counting ends. Then, in response to the rising edges and falling edges of the external clock signal CK, the read data is output ((Dn,A), (Dn,B), (Dn+1,A), (Dn+1,B) shown in the figures).

During the period when the chip selection signal CS # is set to be asserted, the first period tCKD is defined as follows: it begins at the last falling edge of the external clock signal CK (in the example, this is the falling edge of the eighth clock pulse) and it ends when the output of the last read data (Dn+1, B) begins. In addition, the predetermined period tCSH is defined as follows: it begins at the last falling edge of the external clock signal CK (the falling edge of the eighth clock pulse) and ends when the chip selection signal CS # is negated. The second period tOZ is defined as follows: it begins when the chip selection signal CS # is negated and ends when the output of the data signal DQ is complete. In addition, the predetermined period tCSH, the first period tCKD, and the second period tOZ are generally set according to the pSRAM specifications.

Here, the maximum value of the first period tCKD is set as 5 ns, and the minimum value thereof is set 0 ns. The maximum value of the second period tOZ is set as 5 ns, but no minimum value is set for the second period tOZ. In addition, the minimum value of the predetermined period tCSH is set as 0 ns, but no maximum value is set for the predetermined period tCSH. Therefore, for example, if the predetermined period tCSH is set to the minimum value (0 ns), when the magnitude relationship between the first period tCKD and the second period tOZ is tCKD>tOZ, the read operation ends before the last read data of the data signal DQ is output, so the last read data cannot be output, as shown in FIG. 1(B).

In order to prevent the above situation and end the output of the last read data, as shown in FIG. 1(C), it is considered that the predetermined period tCSH is set to be much larger than 0 ns; or as shown in FIG. 1(D), dummy data ((Dn+2, A) shown in the figure) is output in response to the ninth clock pulse after the eighth clock pulse, and the chip selection signal CS # becomes negated at the falling edge of the ninth clock. However, in the cases of FIG. 1(C) and FIG. 1(D), the read cycle is lengthened, and the delay time of the chip selection signal CS # causes the increase in the standby time, which will affect the next read operation. In addition, in the case of FIG. 1(D), unnecessary data (dummy data) is output after the last read data, which increases active current consumption due to the output of the unnecessary data.

BRIEF SUMMARY OF THE INVENTION

Thus, one exemplary embodiment of the present invention provides a semiconductor memory. The semiconductor memory comprises an adjustment circuit. The adjustment circuit sets a second period longer than a first period and adjusts time at which the last read data is output. When a chip selection signal is set to be asserted, the semiconductor memory device performs a read operation on data according to an external clock signal. The first period begins when a rising edge or a falling edge of the external clock signal occurs and ends when the output of the last read data begins. The second period begins when the chip selection signal goes from asserted to negated and ends when the output of the last read data is complete. The external clock signal is used to read the last read data during the read operation.

Another exemplary embodiment of the present invention provides a method for controlling a semiconductor memory. The method comprises the following steps: by an adjustment circuit configured in the semiconductor memory, setting a second period longer than a first period and adjusting time at which the last read data is output. When a chip selection signal is set to be asserted, the semiconductor memory device performs a reading operation on data according to an external clock signal. The first period begins at a rising edge or a falling edge of the external clock signal and ends when the output of the last read data begins. The second period starts when the chip selection signal goes from asserted to negated and ends when the output of the last read data is complete. The external clock signal is used to read the last read data during the read operation.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIGS. 1(A)~1(D) are timing diagrams showing the timing of signals in a conventional semiconductor memory device;

DETAILED DESCRIPTION OF THE INVENTION

The following description is of the best-contemplated model of carrying out the invention. This description is made for the purpose of illustrating the general principles of the invention and should not be taken in a limiting sense. The scope of the invention is best determined by reference to the appended claims.

Figure 2:
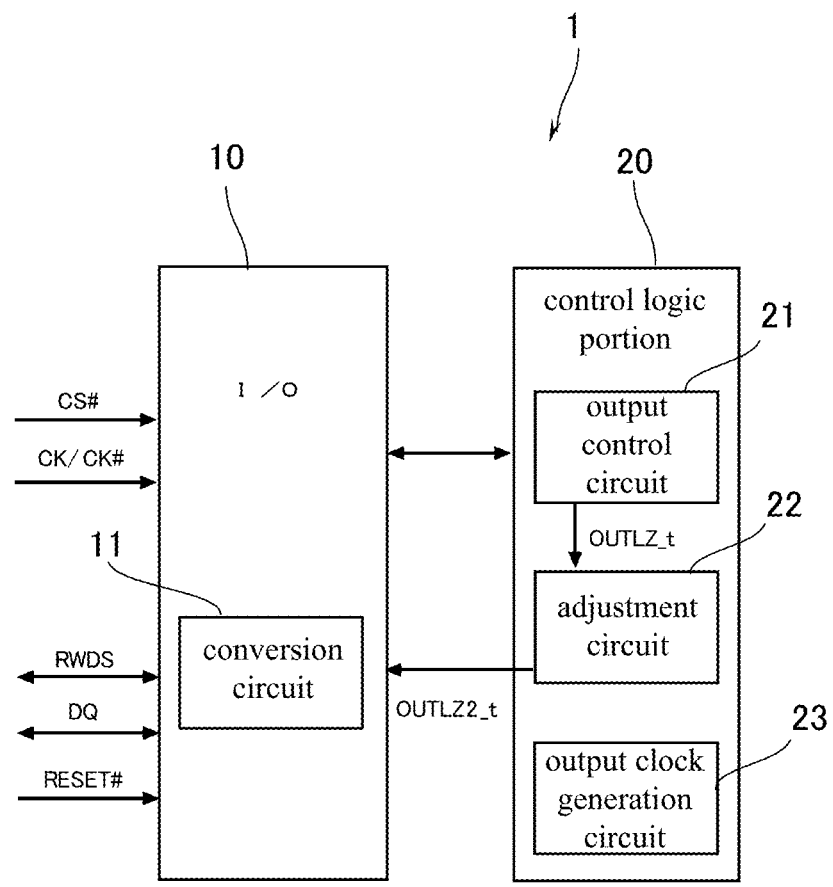
FIG. 2 is a block diagram showing the configurations of an input/output interface (I/O) portion and a control logic portion in a semiconductor memory device according to a first embodiment of the present invention.

FIG. 2 is a block diagram showing the structure of a memory chip of a semiconductor memory device according to a first embodiment of the present invention. The semiconductor memory device of the present embodiment comprises a memory chip 1. When a chip selection signal is set to be asserted, a read operation for the memory chip 1 is enabled. During the read operation, data is read in response to an external clock signal. In the embodiment, the memory chip 1 comprises an input/output interface (I/O) portion 10 and a control logic portion 20.

For example, the I/O portion 10 receives a chip selection signal CS #, a clock signal CK, a reset signal RESET # and the like from an external device such as a memory controller (not shown in the figures), and also transmits or receives a data signal DQ and a read/write data strobe signal RWDS. In addition, the control logic portion 20 performs a read operation or a write operation on the data of the memory cells (not shown in the figures) in the memory cell array in response to a command received from an external device. In the embodiment, the clock signal CK is an example of the "external clock signal" in the present invention.

The semiconductor memory device of the embodiment may be any semiconductor memory device (for example, a DRAM, a pSRAM, an SRAM, etc.). In addition, in the embodiment, the semiconductor memory device is described by taking a pSRAM that uses a HyperBus™ interface as an access interface. In the embodiment, as the example shown in FIG. 1, the value of the latency counting in the process of the read instruction is set as 4 to read the data whose data length is 4 for description.

The I/O portion 10 comprises a parallel-series conversion output circuit (hereinafter, referred to as a "conversion circuit") 11 that is shown in detail in FIG. 4. In addition, the control logic portion 20 comprises an output control circuit 21, an adjustment circuit 22 that is shown in detail in FIG. 3, and an output clock generation circuit 23.

In the embodiment, the adjustment circuit 22 adjusts the time at which the last read data is output so that a second period tOZ becomes longer than a first period tCKD. The first period begins at a rising or falling edge of the external clock signal CK used for the last read data in the read operation and ends when the output of the last read data begins (the data signal DQ corresponding to the last read data becomes asserted). The second period begins when the chip selection signal CS # goes from asserted to negated and ends when the output of the last read data is complete (for example, the data signal DQ corresponding to the last read data is switched to a high impedance state).

Figure 4:
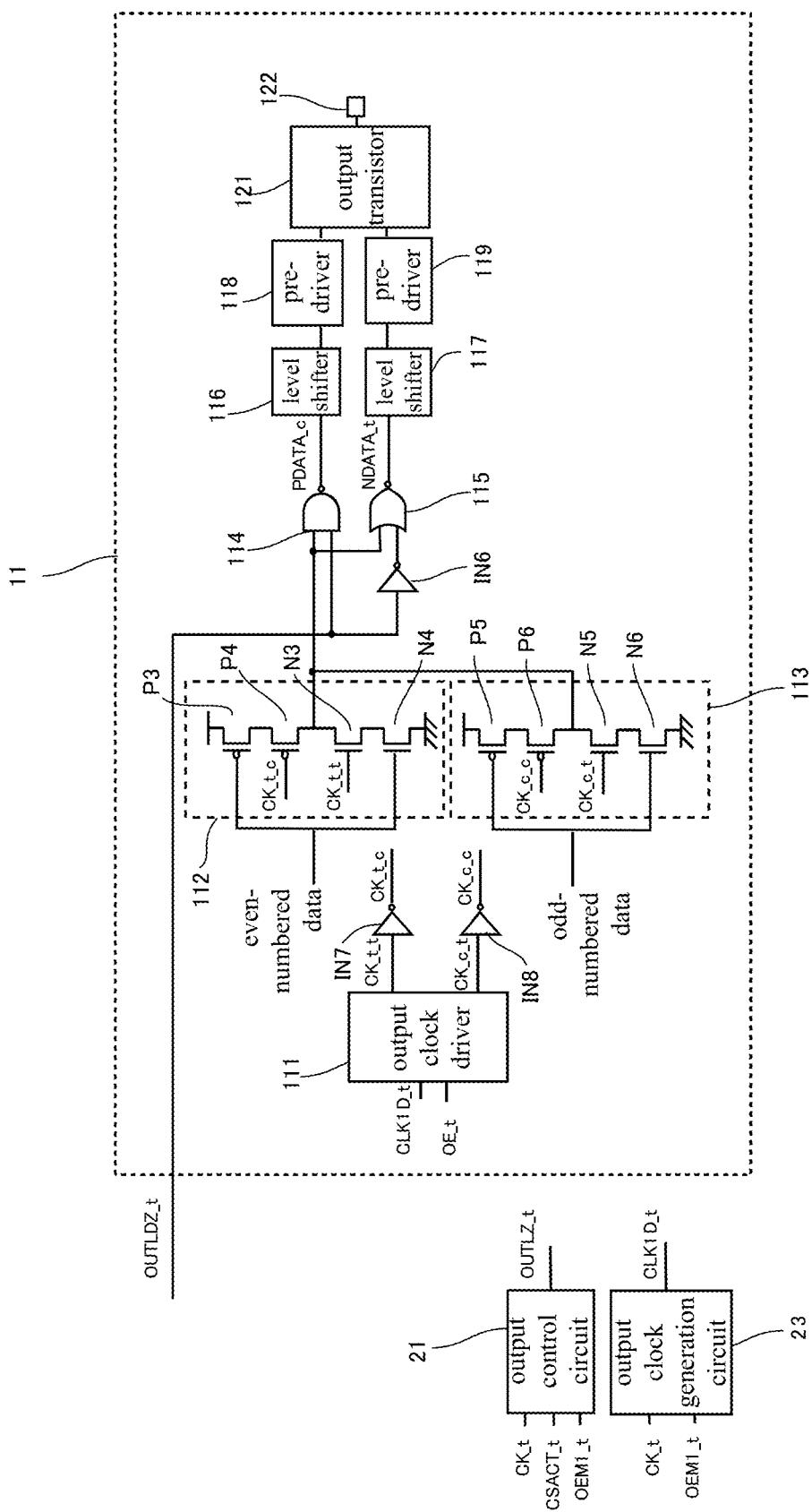
FIG. 4 is a schematic diagram showing the structure of a conversion circuit in the input/output interface (I/O) portion.

As shown in FIG. 4, the inputs of the output control circuit 21 comprise a clock signal CK_t, an inverted chip selection signal CSACT, and a reading-operation outputting enable signal (hereinafter referred to as "outputting enable signal") OEM1_t that is set to be asserted (high level) in response to the first counted pulse (in FIG. 1, the third counted pulse) of the clock signal CK_t for the latency counting, and the output control circuit 21 further outputs a signal OUTLZ_t.

Specifically, when the chip selection signal CS # goes from negated (high level) to asserted (low level), the inverted chip selection signal CSACT is at a high level. That is, when the output enable signal OEM1_t is at a high level, the output control circuit 21 asserts the output signal OUTLZ_t based on the input clock signal CK_t. In addition, when the chip selection signal CS # goes from asserted to negated for ending the read operation, the inverted chip selection signal CSACT is switched to a low level, and the output control circuit 21 changes the signal OUTLZ_t to a low level.

As shown in FIG. 4, when the output enable signal OEM1_t is at the high level, the output clock generation circuit 23 outputs a clock signal CLK1D_t corresponding to the clock signal CK_t.

Figure 3:
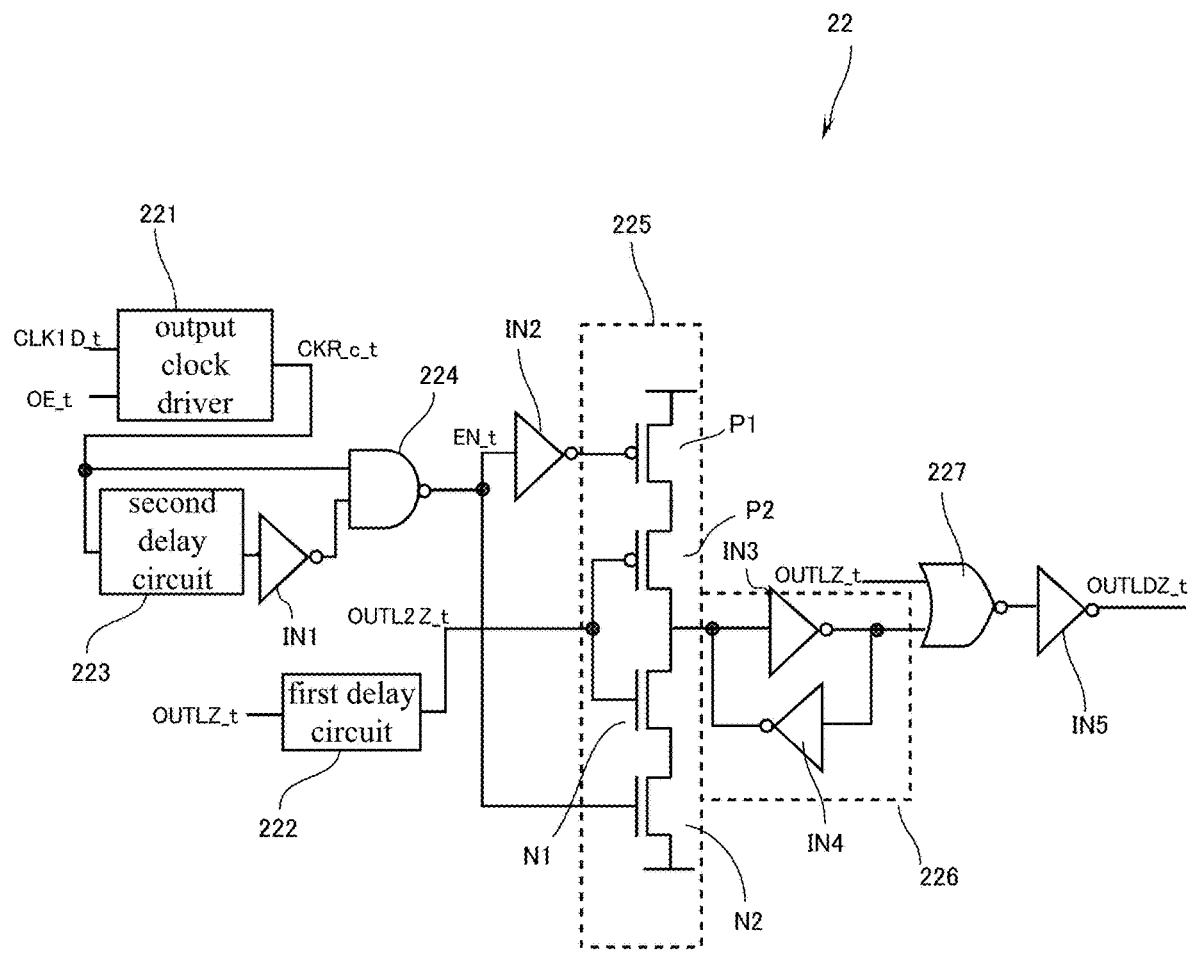
FIG. 3 is a schematic diagram showing the structure of an adjustment circuit in the control logic portion.

The adjustment circuit 22 shown in FIG. 3 comprises an output clock driver 221, a first delay circuit (first delay device) 222, a second delay circuit (second delay device) 223, a NAND circuit 224, a first gate circuit 225, a latch circuit 226, a NOR circuit 227, and first to fifth inverters IN1~IN5. The first gate circuit 225 comprises first and second P-type MOSFETs (metal-oxide-semiconductor field effect transistor, hereinafter referred to as "MOS transistor") P1 and P2 and first and second N-type MOS transistors N1 and N2. The first P-type MOS transistor P1, the second P-type MOS transistor P2, the first N-type MOS transistor N1, and the second N-type MOS transistor N2 are connected in series between a high-voltage power source and a low-voltage power source, as shown in FIG. 3. In the embodiment, a gating latch circuit is composed of the first gate circuit 225 and the latch circuit 226.

The clock signal CLK1D_t and the output enable signal OE_t output from the output control circuit 21 are input to the output clock driver 221. Here, the output enable signal OE_t is maintained at a low level during the period that begins when the read operation begins to the time and ends when the latency counting is complete and then asserted (high level) after the latency counting is complete. In addition, when the output enable signal OE_t is at a high level, the output clock driver 221 outputs an internal clock signal CKR_c_t having a low level in response to the rising edges of the clock signal CLK1D_t and outputs the internal clock signal CKR_c_t having a high level in response to the falling edges of the clock signal CLK1D_t. Here, the internal clock signal CKR_c_t may be used for passing and maintaining the input signal (the signal OUTL2Z_t described later) in the gating latch circuit.

Next, the operation of the adjustment circuit 22 will be described. The output clock driver 221 generates the internal clock signal CKR_c_t. In the second delay circuit 223, the internal clock signal CKR_c_t is delayed by a predetermined delay amount. In addition, the delay amount provided by the second delay circuit 223 may be arbitrarily adjusted. In the NAND circuit 224, a NAND operation is performed on the two input signals (the internal clock signal CKR_c_t and the delayed internal clock signal CKR_c_t) to generate a gate signal EN_t.

In addition, when the signal OUTLZ_t generated by the input control circuit 21 is input to the first delay circuit 222, the first delay circuit 222 generates a signal OUTL2Z_t that is delayed from the signal OUTLZ_t by a predetermined delay amount. In the first delay circuit 222, when the gate signal EN_t is switched to a low level, the delay amount may be set to cause the input signal OUTL2Z_t to be switched to the low level.

The signal OUTL2Z_t is the input signal of the first gate circuit 225, that is, the signal OUTL2Z_t is an example of the "input signal" of the present invention. In addition, the gate signal EN_t controls the gating latch circuit comprising the first gate circuit 225 and the latch circuit 226. In other words, when the gate signal EN_t is at a high level, the input signal (that is, the signal OUTL2Z_t) passes through the first gate circuit 225 and the latch circuit 226 and is output; when the gate signal EN_t is at the low level, the input signal OUTL2Z_t that is input when the gate signal EN_t is at the low level cannot pass through the first gate circuit 225, and the signal latched by the latch circuit 226 is output.

The NOR circuit 227 performs a NOR operation to generate the output signal OUTLDZ_t. The output signal OUTLDZ_t is an example of the "output signal" of the present invention. By inputting the output signal OUTLDZ_t to the conversion circuit 11, the conversion circuit 11 can adjust the time at which the last read data of the data signal DQ is output. Next, the conversion circuit 11 will be described with reference to FIG. 4.

The conversion circuit 11 comprises the output clock driver 111, a second gate circuit 112, a third gate circuit 113, a NAND circuit 114, a NOR circuit 115, first and second level shifters 116 and 117, first and second pre-drivers 118 and 119, an output transistor 121, a DQ pad 122, and a sixth inverter IN6.

The even-numbered data from the memory array (the data output to the outside in response to the rising edges of the external clock signal) is input to the respective gates of the third P-type MOS transistor P3 and the fourth N-type MOS transistor N4.

When the output enable signal OE_t input to the output clock driver 111 is at the high level and the internal clock signal CLK1D_t is at a high level, the generated internal clock signal CK_t_t is at a high level, and the internal clock signal CK_t_c is at a low level. In this case, in response to the rising edges of the clock signal CK, the even-numbered data passes through the second gate circuit 112 and then is output. When the output enable signal OE_t is at the high level and the internal clock signal CLK1D_t input to the output clock driver 111 is at the high level, the generated internal clock signal CK_c_t is at a high level, and the internal clock signal CK_c_c is at a low level. In this case, in response to the falling edges of the clock signal CK, the odd-numbered data passes through the third gate circuit 113 and then is output.

That is, in the conversion circuit 11, when the output signal OUTLDZ_t serving as the input signal is at a high level, the NAND circuit 114 and the NOR circuit 115 are switched to an enabled state, and the DQ pad 122 is switched to a low impedance state. Then, in response to the internal signals CK_t_c and CK_c_c, the even-numbered data and odd-numbered data input to the second and third gate circuits 112 and 113 are output from the DQ pads 122. Specifically, when the output enable signal OE_t is at the high level and the signal CLK1D_t is at the high level, the even-numbered data is output; when the output enable signal OE_t is at the high level and the signal CLK1D_t is at the low level, the odd-numbered data is output. On the other hand, when the output signal OUTLDZ_t is at a low level, the NAND circuit 114 and the NOR circuit 115 are switched to a disabled state, and the DQ pad 122 is switched to a high impedance state.

The read operation will be described using the timing chart shown in FIG. 5. The beginning process of the read operation is the same as that shown in FIG. 1, the description is omitted in the embodiment.

At the time t501, the chip selection signal CS # is at the low level. The clock signal CK is at a latency-counting end state that is not shown in FIG. 5. The clock pulse of the clock signal CK that is first calculated clock pulse after the time t501 when the data reading begins serves as the first clock pulse of the clock signal CK. When the first clock pulse of the clock signal CK is input, the internal clock signal CK_c_t/internal clock signal CKR_c_t is generated according to the first clock pulse of the clock signal CK. For example, at the time t501, the clock signal CK rises, and at the time t502, the internal clock signal CK_c_t/internal clock signal CKR_c_t falls. In addition, at the time t503, the clock signal CK falls, and at the time t504, the internal clock signal CK_c_t/internal clock signal CKR_c_t rises. In the embodiment, after the latency counting ends, two clock pulses of the clock signal CK corresponding to the data reading are input, and two clock pulses of the internal clock signal are input correspondingly.

In addition, according to the clock signal CK, the data outputting starts. For example, in response to the rising edge of the first clock pulse of the clock signal CK at the time t501, the even-numbered data (the read data (Dn,A) shown in the figure) is output at the time t502. In response to the falling edge of the first clock pulse of the clock signal CK at the time t503, the odd-numbered data (the read data (Dn,B) shown in the figure) is output at the time t504. In response to the rising edge of the second clock pulse of the clock signal CK at the time t505, the even-numbered data (the read data (Dn+1,A) shown in figure) is output.

Here, between the time t501 and the time t506, since the chip selection signal CS # is at the low level, the output enable signal OEM1_t that is input to the output control circuit 21 is at the high level, and the inverted chip selection signal CSACT is at the high level. Therefore, during the period from the time t501 to the time t506, the signals OUTLZ_t, OUTL2Z_t, and OUTLDZ_t are at a high level.

At the time t504, when the internal clock signal CKR_c_t is switched to the high level, the gate signal EN_t is switched to the low level. The gate signal EN_t is maintained at the low level according to the internal clock signal CKR_c_t delayed by the second delay circuit 223 until the time t506. Accordingly, the gate signal EN_t is maintained at the low level based on the delay amount of the second delay circuit 223 (that is, the pulse width is adjusted) and then output.

In this case, when the second clock pulse of the clock signal CK is switched to the low level from the high level at the time t507, since tCSH=0 is set in the embodiment, the chip selection signal CS # is switched to the high level from the low level at the time t507.

In addition, at the time t507, when the second clock pulse is switched to the low level from the high level, the internal clock signal CK_c_t/internal clock signal CKR_c_t is switched to the high level from the low level at the time t509 in response to the falling edge of the second clock pulse. In response to the change of the internal clock signal CK_c_t/ internal clock signal CKR_c_t, the odd-numbered data (the read data (Dn+1, A) shown in the figure) is output at the time t511.

On the other hand, in response to the falling edge of the clock signal CK at the time t507, the chip selection signal CS # is also switched to the high level from the low level, and the inverted chip selection signal CSACT_t is switched to the low level from the high level. As a result, the signal OUTLZ_t output from the output control circuit 21 is switched to the low level from the high level at the time t508. Accordingly, the signal OUTL2Z_t is also switched to the low level from the high level at the time t510.

Then, at the time t509, when the internal clock signal CK_c_t/the internal clock signal CKR_c_t is switched to the high level from the low level, the gate signal EN_t is switched to the low level from the high level again. Through delaying the internal clock signal CK_c_t/CKR_c_t by the second delay circuit 223, the gate signal EN_t is switched to the high level from the low level at the time t512. In response to the gate signal EN_t being switched to the high level at the time t512, the signal OUTLZ_t that has been switched the low level at the time t508 passes through the first gate circuit 225 and the latch circuit 226, and the output signal OUTLDZ_t is switched to the low level from the high level.

Then, by inputting the low-level output signal OUT-LDZ_t to the conversion circuit 11, at the time t513, the DQ pad 122 is switched to the high-impedance state, the output of the last read data of the data signal DQ ends, and the read operation ends. Therefore, in the embodiment, the last read data of the data signal DQ can be reliably output. In this case, the magnitude relationship between the second period tOZ that begins at the time t507 and ends at the time t513 and the first period tCKD that begins at the time t507 and ends at the time t511 satisfies the relationship tCKD tOZ.

In the embodiment, the magnitude relationship between the second period tOZ and the first period tCKD can be continuously set as tCKD tOZ, and the last read data can be efficiently output within the range defined by the specifications. Moreover, in the embodiment, through configuring the adjustment circuit 22, it is not necessary to set the predetermined period tCSH to be very long as shown in FIG. 1(C), so the predetermined period tCSH can be set to the minimum value (that is, 0). In this way, it is possible to prevent the read cycle time or the standby time from being elongated and affecting the next read operation. In the embodiment, the chip selection signal CS # is set to be negated (high level) at the same time when the external clock signal CK used to read the last read data falls (in other words, the predetermined period tCSH is 0 ns)). Thus, the read cycle time or standby time can be shortened and the predetermined period tCSH may be set to be longer than 0 (tCSH>0). Even in this case, the last read data of the data signal DQ can be reliably output.

Figure 5:
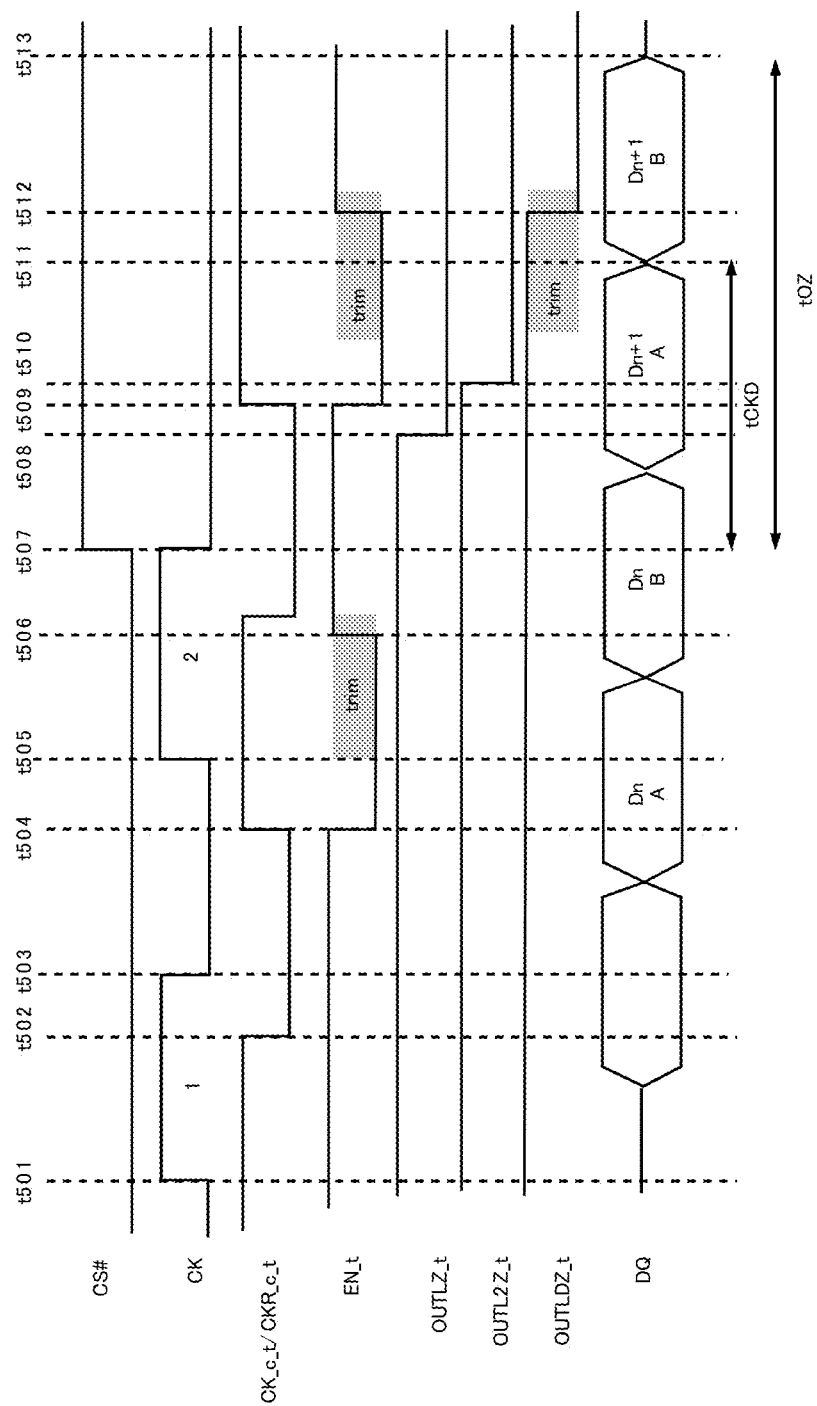
FIGS. 5~6, 8(A) and 8(B) are timing charts showing the timing of signals in the semiconductor memory device.

The timing chart shown in FIG. 5 shows an example of the operation of the semiconductor memory device when the processing of the semiconductor memory device is classified to a class of high speed, or a class of medium speed, or a class between medium speed and high speed. At this time, since the first period tCKD is short (for example, tCKD is about 3 ns), by setting the delay amount provided by the second delay circuit 223 to be greater, the period during which the gate signal EN_t is at the low level is adjusted to be longer, and the time point when the output signal OUTLDZ_t is switched to the low level is delayed. In addition, in FIG. 5 and FIG. 6, the time range of the gate signal EN_t and the time range of the output signal OUTLDZ_t are adjusted by the second delay circuit 223, which are represented by "trim".

Figure 6:
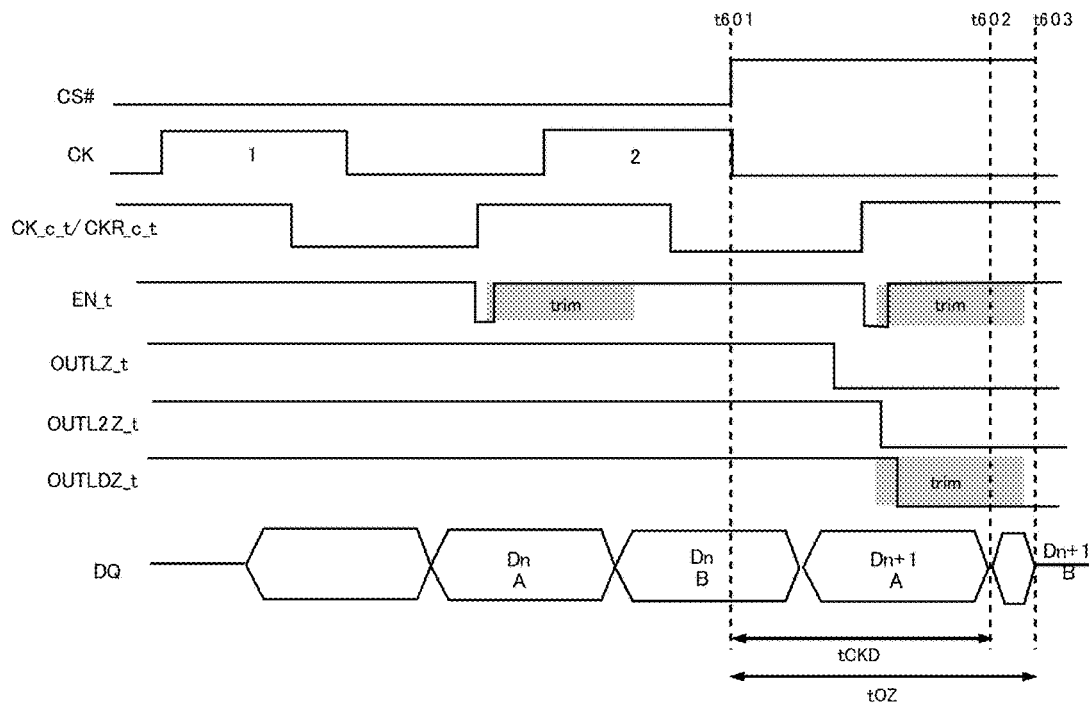

In contrast, the timing chart of FIG. 6 shows an example of the operation of the semiconductor memory device when the processing of the semiconductor memory device is classified to the class of low speed. At this time, the first period tCKD that begins at the time t601 corresponding to the falling edge of the second clock pulse and ends at the time t602 when the corresponding data signal is output is longer than the first period tCKD shown in FIG. 5 (for example, tCKD shown in FIG. 6 is about 4.7 ns). Therefore, by setting the delay amount provided by the second delay circuit 223 to be shorter, the period during which the gate signal EN_t is at the low level is shortened. As a result, the second period tOZ that begins at the time t601 when the chip selection signal CS # rises and ends at the time t603 when the read operation ends can be controlled to be close to the maximum value in the specifications. Even in this case, the adjustment circuit 31 can continuously set the magnitude relationship between the second period tOZ and the first period tCKD as tCKD≤tOZ, and the last read data can be output.

Therefore, the delay amount can be adjusted according to the individual characteristics of the semiconductor memory device (for example, hardware processing, power supply voltage, temperature, etc.) caused by factors (for example, manufacturing variations of the semiconductor memory device). Accordingly, a corresponding optimal delay amount can be set according to the characteristics of the semiconductor memory device, so that the cycle time can be prevented from be lengthened.

The delay amount provided by the second delay circuit 223 is set by slightly changing the delay amount and measuring the second period tOZ so that the second period tOZ may be changed to a value close to the optimum value (for example, 5 ns). In addition, a ring oscillator having the same configuration as that of the second delay circuit 223 is installed in the semiconductor memory device. Through measuring the relationship between the frequency of the ring oscillator and the second period tOZ individually by several kinds of hardware processing, the optimum delay amount of each kind of hardware processing is set.

In the embodiment shown in FIG. 6, the output period of the last read data (Dn+1, B) seems to be short. However, for example, when the semiconductor memory device is a pSRAM, since the output pin of the data signal DQ is mostly used as an open terminal, the last read data (Dn+1, B) can be maintained in the output pin of the data signal DQ for a certain period of time before the next read operation starts. Accordingly, the memory controller can receive the last read data (Dn+1,B) from the semiconductor memory device. In addition, the output period of the last read data (Dn+1, B) can be set longer by setting the predetermined period tCSH.

In the following paragraphs, a second embodiment of the present invention will be described. In the embodiment, an adjustment circuit 31 comprises a plurality of gating latch circuits (two gating latch circuits in the embodiment). The gating latch circuits allow input signals (the signal OUTLZ_t and the signal OUTL2Z_t) to pass at different time points, respectively. In the present embodiment, since the above-mentioned delay circuits (the first delay circuit 222 and the second delay circuit 223) are not provided in the adjustment circuit 31, the adjustment circuit 31 can be configured simply.

In the embodiment, when the gating latch circuit on the upstream side of the plurality of gating latch circuits is controlled by the internal clock signals CKR_c_t and CKR_c_c to allow the signal OUTLZ_t to pass, the adjustment circuit 31 controls the gating latch circuit on the downstream side of the plurality of gating latch circuits through the internal clock signals CKR_c_t and CKR_c_c, so that the input signal OUTL2Z_t passing through the gating latch circuit on the upstream side can be maintained. In addition, when the gating latch circuit on the upstream side is controlled by the internal clock signals CKR_c_t and CKR_c_c to cause the signal OUTLZ_t to be maintained, the adjustment circuit 31 controls the gating latch circuit on the downstream side through the internal clock signals CKR_c_t and CKR_c_c, so that the signal OUTL2Z_t maintained in the gating latch circuit on the downstream side can pass.

Figure 7:
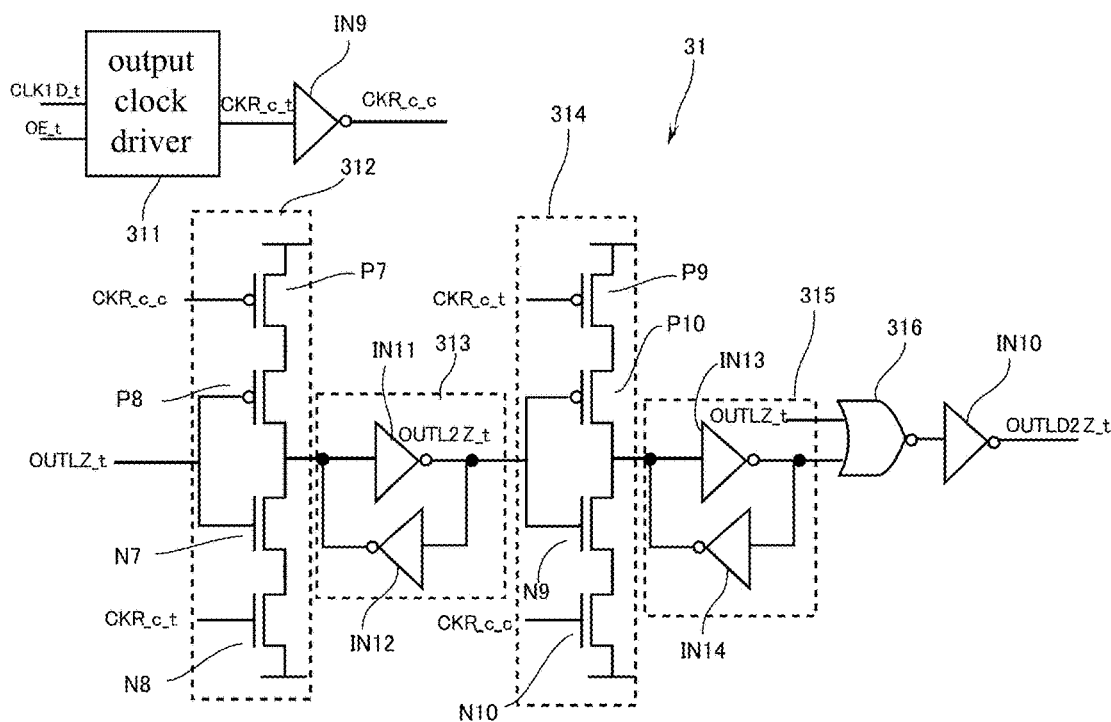
FIG. 7 is a schematic diagram showing the configuration of an adjustment circuit according to a second embodiment of the present invention;
m

The adjustment circuit 31 of the present embodiment shown in FIG. 7 comprises an output clock driver 311, a fourth gate circuit 312, a second latch circuit 313, a fifth gate circuit 314, a third latch circuit 315, a NOR circuit 316, a ninth inverter IN9, and a tenth inverter IN10.

In the embodiment, the fourth gate circuit 312 and the second latch circuit 313 constitute the gating latch circuit on the upstream side, and the fifth gate circuit 314 and the third latch circuit 315 constitute the gating latch circuit on downstream side. The two gating latch circuits are connected in series for the input signal.

The output clock driver 311 generates and outputs the internal clock signal CKR_c_t. The internal clock signal CKR_c_t is input to the ninth inverter IN9 for logical inversion to generate the internal clock signal CKR_c_c.

In the fourth gate circuit 312, when the internal clock signal CKR_c_c is at a low level, the signal OUTLZ_t passes through the fourth gate circuit 312. The signal OUTLZ_t output from the fourth gate circuit 312 serves as the signal OUTL2Z_t output from the second latch circuit 313 when the internal clock signal CKR_c_c input to the second latch circuit 313 is at a high level.

In the fifth gate circuit 314, when the internal clock signal CKR_c_t is at a low level, the signal OUTL2Z_t passes through the fifth gate circuit 314. The signal OUTL2Z_t output from the fifth gate circuit 314 is output from the second latch circuit 313 and input to the NOR circuit 316 when the internal clock signal CKR_c_c input to the third latch circuit 315 is at the high level. In addition, the signal OUTLZ_t is input to the NOR circuit 316 for the NOR calculation. The signal generated by the NOR circuit 316 is input to the tenth inverter IN10 for logical inversion, and an output signal OUTLD2Z_t is generated. Here, the output signal OUTLD2Z_t in the embodiment is an example of the "output signal" of the present invention. The generated output signal OUTLD2Z_t is input to the conversion circuit 11 shown in the first embodiment.

In the embodiment, the internal clock signal CKR_c_t and the internal clock signal CKR_c_c that is obtained by logically inversing the internal clock signal CKR_c_t control the gating latch circuits on the upstream side and the downstream side respectively. In response to the internal clock signals CKR_c_t and CKR_c_c, the signal OUTLZ_t input to the fourth gate circuit 312 passes through each gating latch circuit, thereby generating an output signal OUTLD2Z_t that is delayed from the signal OUTLZ_t by a predetermined delay amount.

The read operation of the embodiment will be described using the timing chart shown in FIG. 8. The portions of the timing chart in FIG. 8 that are the same as the timing chart in FIG. 5 will be omitted. At the time t701, the second clock pulse of the clock signal CK is switched to a low level from a high level, and correspondingly, at the time t703, the internal clock signal CKR_c_t rises. At the time t706, the last read data is output, that is, the odd-numbered data (the read data (Dn+1,B) shown in figure) is output. In addition, in the embodiment, after the chip selection signal CS # rises, the clock signal CK is input continuously, so the third clock pulse is input at time t705.

When the chip selection signal CS # is switched to a high level from a low level at the time t701, the signal OUTLZ_t is switched to a low level from a high level at the time t702. Then, at the time t703, the internal clock signal CKR_c_t is switched to the high level from the low level, and at the same time, the internal clock signal CKR_c_c is switched to the low level from the high level. Therefore, at the time t704, the signal OUTL2Z_t is switched to a low level from a high level. Then, when the internal clock signal CKR_c_t is switched to the high level from the low level at the time t707, the low-level signal OUTLZ_t can pass through the gating latch circuit on the downstream side, so the output signal OUTLD2Z_t is also switched to a low level from a high level. Accordingly, through inputting the low-level output signal OUTLD2Z_t to the conversion circuit 11, the read operation of the last read data (Dn+1, B) is completed at the time t708.

As described above, in the embodiment, the magnitude relationship between the second period tOZ that begins at the time t701 and ends at the time t708 and the first period tCKD that begins at the time t701 and ends at the time t706 satisfies tCKD≤tOZ. As shown in FIG. 8(B), when the processing of the semiconductor memory is classified to a class of low speed, the first period tCKD becomes longer than that in FIG. 8(A) (for example, tCKD is about 4.7 ns), and the second period tOZ becomes longer than the maximum value of the specifications. In this case, the period that begins when the clock signal CK rises after the chip selection signal CS # rises and ends the output of the last read data (Dn+1, B) is complete is defined as a corrected second period tOZ'. By setting the corrected second period tOZ' to be less than the maximum value in the specifications of the second period tOZ, the specifications can be satisfied, and the magnitude relationship tCKD≤tOZ can be satisfied. Therefore, the read operation of the last read data (Dn+1, B) can be completed.

Specifically, the period that begins at the time t802 when the third clock pulse of the clock signal CK rises and ends at the time t804 when the last read data (Dn+1, B) ends is defined as a corrected second period tOZ'. The relationship between second period tOZ and the first period tCKD that begins at the time t801 and ends at the time 803 when the beginning of the output of the last read data (Dn+1, B) can satisfies the magnitude relationship tCKD≤tOZ, and the corrected second period tOZ' can be set to be less than the maximum value in the specifications of the second period tOZ.

Figure 8A:
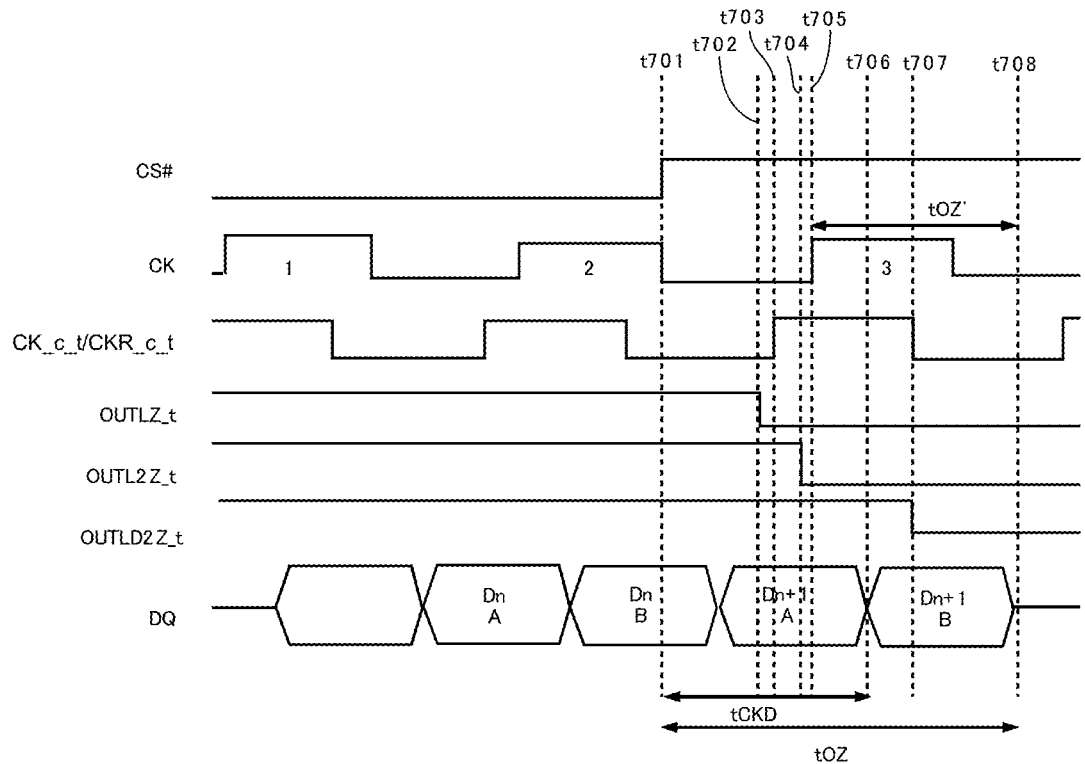
Figure 8B:
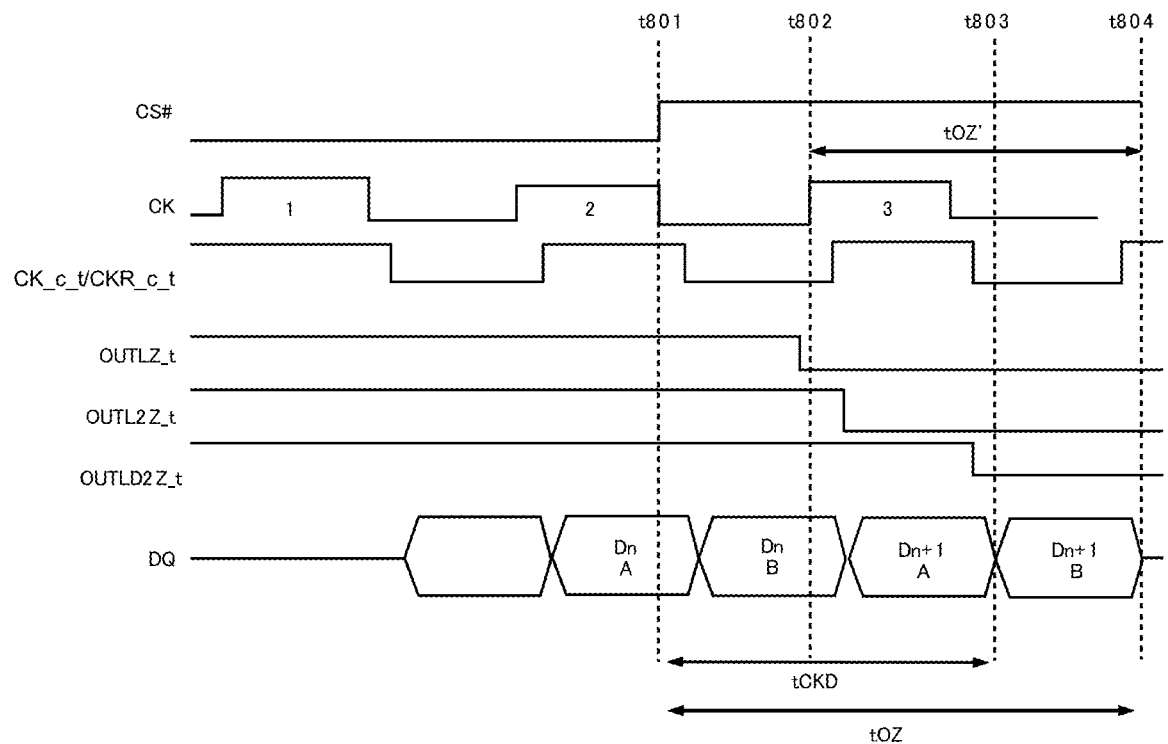

As described above, in the embodiment, regardless of the cases of FIG. 8(A) and FIG. 8(B), the magnitude relationship between the second period tOZ and the first period tCKD can satisfy tCKD≤tOZ. Therefore, the data can be read appropriately without performing the inactivation process on the semiconductor memory device during the read operation of the last read data (Dn+1,B). Compared with the case shown in FIG. 1, in such a configuration, since the reading cycle time becomes shorter, increasing the reading cycle time may be avoided. In addition, since no unnecessary data (dummy data) is output, there is less of a problem with active current consumption.

The adjustment circuit 31 of the present embodiment comprises two gating latch circuits connected in series for the input signal, so that gating latch circuits allow the input signal to pass at different time points, respectively. As described above, the magnitude relationship between the second period tOZ and the first period tCKD satisfies the relationship tCKD≤tOZ. Thus, the data can be read reliably without performing the inactivation process on the semiconductor memory device during the read operation of the data.

Figure 9:
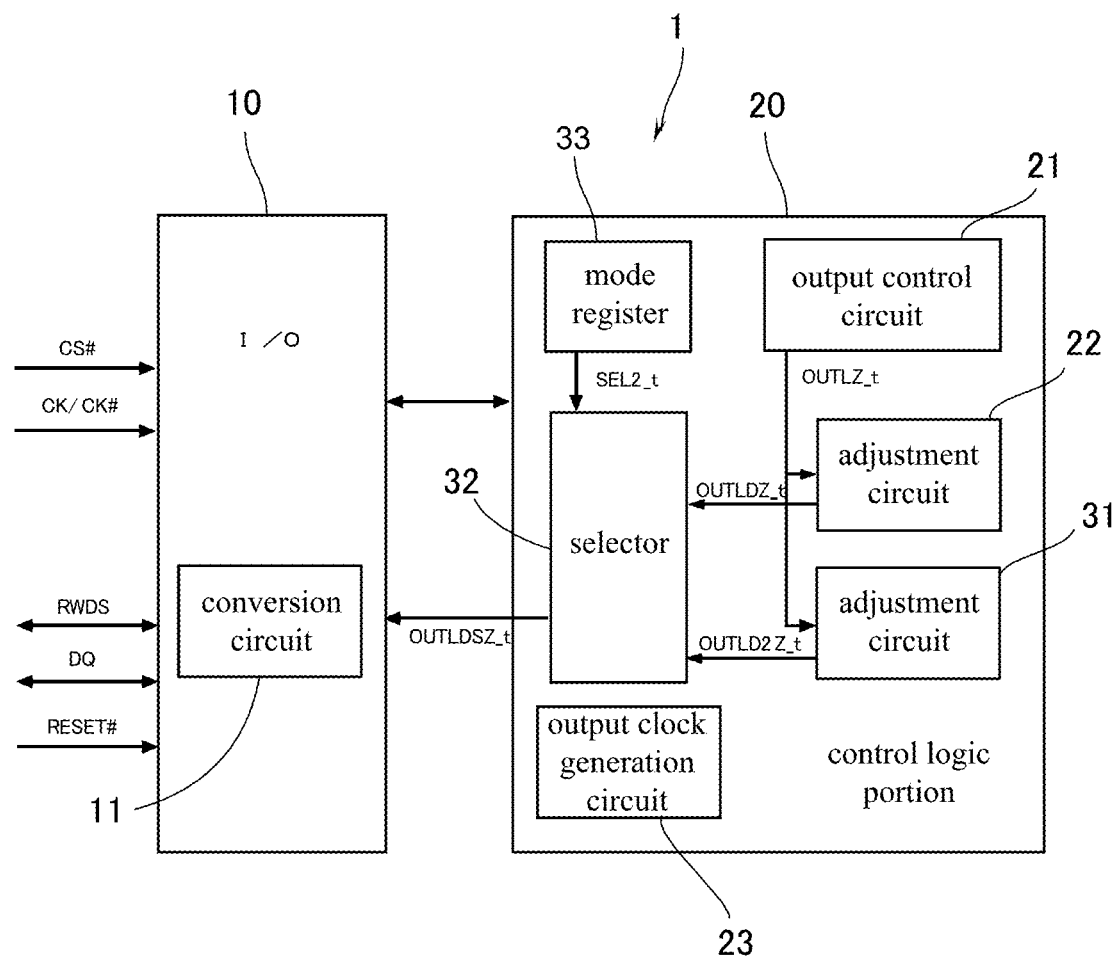
FIG. 9 is a block diagram showing the configurations of an I/O portion and a control logic portion in a semiconductor memory device according to a third embodiment of the present invention.

FIG. 9 shows a third embodiment of the present invention. In the third embodiment, the control logic portion 20 comprises the above-mentioned adjustment circuits 22 and 31 serving as the first adjustment circuit 22 and the second adjustment circuit 31 respectively and also comprises a selector 32. According to the user's request, the selector 32 is used to set which output signal of the adjustment circuit should be selected.

In the third embodiment, the signal OUTLZ_t generated by the output control circuit 21 is input to the first adjustment circuit 22 and the second adjustment circuit 31. At the same time, the output signal OUTLDZ_t generated by the first adjustment circuit 22 and the output signal OUTLD2Z_t generated by the second adjustment circuit 31 are input to the selectors 32. The selection signal SEL2_t for indicating which of the output signal OUTLDZ_t and the output signal OUTLD2Z_t is to be selected is input to the selector from the mode register 33. The content of the selection signal SEL2_t can be appropriately updated, for example, by writing a command by an external mode register.

Then, the selector 32 selects one of the output signal OUTLDZ_t and the output signal OUTLD2Z_t according to the selection signal SEL2_t as the output signal OUTLDSZ_t that is input to the I/O portion 10. In the I/O portion 10, the conversion circuit 11 controls the data signal DQ based on the output signal OUTLDSZ_t input to the I/O portion 10.

In addition, for example, in each of the above-described embodiments, the case where a HyperBus™ interface is used as an access interface is described as an example, but the present invention is not limited to this case. For example, even if an Expanded Serial Peripheral Interface (xSPI) or an Xccela™ interface is used as the access interface, the same functions and effects as those of the above-mentioned embodiments can be obtained.

In addition, for example, using the adjustment circuits 22 and 31 can control not only the data signal DQ but also the read and write data strobe signal RWDS. In other words, the period that begins at the rising or falling edge of the external clock signal CK used to read the last read data during the read operation and ends when the data strobe signal corresponding to the last read data becomes asserted serves as tCKDS, and the period that begins when the chip selection signal CS # goes from asserted to negated and ends the output of the last read data is complete (the data strobe signal is switched to a high impedance state). In this case, the relationship of tCKDS≤tDSZ can be satisfied, thereby preventing the read cycle time or the standby time from becoming longer and further prevent the effect on the next read operation.

In addition, in each of the above-mentioned embodiments, the first period tCKD may be from the time point when the external clock signal CK_t used to read the last read data rises to the beginning of the output of the last read data.

In the above-mentioned second embodiment, the corrected second period tOZ' may begin when the external clock signal CK falls after the chip selection signal CS # is negated and end the output of the last read data is complete.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor memory, comprising:
   an adjustment circuit setting a second period longer than a first period and adjusting time at which a last read data is output;
   wherein when a chip selection signal is set to be asserted, a semiconductor memory device performs a read operation on data according to an external clock signal,
   wherein the first period begins at a rising edge or a falling edge of the external clock signal and ends when the output of the last read data begins,
   wherein the second period begins when the chip selection signal goes from asserted to negated and ends when the output of the last read data is complete, and
   wherein the external clock signal is used to read the last read data during the read operation.

2. The semiconductor memory as claimed in claim 1, wherein:
   the first period begins at the rising edge or the falling edge of the external clock signal and ends when a data signal or a data strobe signal corresponding to the last read data becomes asserted, and the external clock signal is used to read the last read data, and
   the second period begins when the chip selection signal goes from asserted to negated and ends when the data signal or the data strobe signal is switched to a high impedance state.

3. The semiconductor memory as claimed in claim 1, wherein when the external clock signal used to read the last read data falls, the chip selection signal is set to be negated at the same time.

4. The semiconductor memory as claimed in claim 1, wherein:
   the adjustment circuit comprises a gating latch circuit for controlling passage and maintenance of an input signal,
   the gating latch circuit is used to delay the input signal by a predetermined amount to generate an output signal, and
   according to the output signal, time at which the output of the last read data is complete is delayed so as to control the time at which the last read data is output.

5. The semiconductor memory as claimed in claim 4, wherein:
   the adjustment circuit comprises a first delay device for delaying the input signal,
   the input signal is delayed by the first delay device, and
   the gating latch circuit allows the input signal to pass after maintaining the input signal for a predetermined period, thereby generating the output signal.

6. The semiconductor memory as claimed in claim 4, wherein the adjustment circuit comprises:
   an output clock driver generating an internal clock signal for controlling the passage and maintenance of the input signal in the gating latch circuit according to the external clock signal; and
   a second delay device delaying the internal clock signal, wherein the adjustment circuit delays the internal clock signal using the second delay device and allows the input signal to pass after maintaining the input signal for the predetermined period using the gating latch circuit, thereby generating the output signal, and wherein a delay amount provided by the second delay device is adjusted according to characteristics of the semiconductor memory device.

7. The semiconductor memory as claimed in claim 6, wherein:

when a plurality of gating latch circuits are provided, the plurality of gating latch circuits are connected in series for the input signal, the plurality of gating latch circuits allow the input signal to pass at different respective time points, and the plurality of gating latch circuits comprise two gating latch circuits.

8. The semiconductor memory as claimed in claim 7, wherein:

the adjustment circuit comprises the output clock driver for generating the internal clock signal, and the internal clock signal is used to control the passage and maintenance of the input signal in each of the plurality of gating latch circuits in response to the external clock signal, when the gating latch circuit on an upstream side of the plurality of gating latch circuits is controlled by the internal clock signal to allow the input signal to pass, the gating latch circuit on a downstream side of the plurality of gating latch circuits is controlled by the internal clock signal so that the input signal passing through the gating latch circuit on the upstream side is maintained, and when the gating latch circuit on the upstream side is controlled by the internal clock signal to cause the input signal to be maintained, the gating latch circuit on the downstream side is controlled by the internal clock signal so that the input signal maintained in the gating latch circuit on the downstream side passes through.

9. A semiconductor memory, comprising:

a first adjustment circuit, a second adjustment circuit; and a selection portion selecting one of the first adjustment circuit and the second adjustment circuit to adjust the time at which the last read data is output, wherein each of the first adjustment circuit and the second adjustment circuit is configured to set a second period longer than a first period and adjusting time at which the last read data is output and comprises a gating latch circuit for controlling passage and maintenance of an input signal, wherein the gating latch circuit of each of the first adjustment circuit and the second adjustment circuit is used to delay the input signal by a predetermined amount to generate an output signal, and according to the output signal, time at which the output of the last read data is complete is delayed so as to control the time at which the last read data is output, wherein the first adjustment circuit comprises a first delay device for delaying the input signal, the input signal is delayed by the first delay device, and the gating latch circuit of the first adjustment circuit allows the input signal to pass after maintaining the input signal for a predetermined period, thereby generating the output signal, and wherein the second adjustment circuit comprises:

an output clock driver generating an internal clock signal for controlling the passage and maintenance of the input signal in the gating latch circuit of the second adjustment circuit according to the external clock signal; and a second delay device delaying the internal clock signal, wherein the second adjustment circuit delays the internal clock signal using the second delay device and allows the input signal to pass after maintaining the input signal for the predetermined period using the gating latch circuit of the second adjustment circuit, thereby generating the output signal, wherein a delay amount provided by the second delay device is adjusted according to characteristics of the semiconductor memory device, and wherein when a plurality of gating latch circuits are provided for the second adjustment circuit, the plurality of gating latch circuits are connected in series for the input signal, the plurality of gating latch circuits allow the input signal to pass at different respective time points, and the plurality of gating latch circuits comprise two gating latch circuits.

10. The semiconductor memory as claimed in claim 9, wherein:

the second adjustment circuit comprises the output clock driver for generating the internal clock signal, and the internal clock signal is used to control the passage and maintenance of the input signal in each of the plurality of gating latch circuits of the second adjustment circuit in response to the external clock signal, when the gating latch circuit on an upstream side of the plurality of gating latch circuits of the second adjustment circuit is controlled by the internal clock signal to allow the input signal to pass, the gating latch circuit on a downstream side of the plurality of gating latch circuits of the second adjustment circuit is controlled by the internal clock signal so that the input signal passing through the gating latch circuit on the upstream side is maintained, and when the gating latch circuit on the upstream side is controlled by the internal clock signal to cause the input signal to be maintained, the gating latch circuit on the downstream side is controlled by the internal clock signal so that the input signal maintained in the gating latch circuit on the downstream side passes through.

11. A method for controlling a semiconductor memory, comprising:

by an adjustment circuit configured in the semiconductor memory, setting a second period longer than a first period and adjusting time at which the last read data is output;

wherein when a chip selection signal is set to be asserted, the semiconductor memory device performs a read operation on data according to an external clock signal, wherein the first period begins at a rising edge or a falling edge of the external clock signal and ends when the output of the last read data begins;

wherein the second period begins when the chip selection signal goes from asserted to negated and ends when the output of the last read data is complete, and wherein the external clock signal is used to read the last read data during the read operation.

12. The method for controlling a semiconductor memory as claimed in claim 11, wherein:

the first period begins at the rising edge or the falling edge of the external clock signal and ends when a data signal or a data strobe signal corresponding to the last read data becomes asserted, and the external clock signal is used to read the last read data, and the second period begins when the chip selection signal goes from asserted to negated and ends when the data signal or the data strobe signal is switched to a high impedance state.

13. The method for controlling a semiconductor memory as claimed in claim 11, wherein:
when the external clock signal used to read the last read data falls, the chip selection signal is set to be negated at the same time,
the adjustment circuit comprises a gating latch circuit for controlling passage and maintenance of an input signal, and
the method further comprises a control step in which the adjustment circuit generates an output signal by delaying the input signal by a predetermined amount using the gating latch circuit, and in response to the output signal, time at which the output the last read data is complete is delayed, so as to control the time at which the last read data is output.

14. The method for controlling a semiconductor memory as claimed in claim 13, wherein:
the adjustment circuit comprises a first delay device for delaying the input signal,
the method further comprises a generation step in which the adjustment circuit allows the input signal to pass after maintaining the input signal for a predetermined period using the first delay device, thereby generating the output signal.

15. The method for controlling a semiconductor memory as claimed in claim 13, wherein the adjustment circuit comprises:
an output clock driver generating an internal clock signal for controlling passage and maintenance of the input signal in the gating latch circuit in response to the external clock signal; and
a second delay device delaying the internal clock signal,
the method further comprises a generation step in which the adjustment circuit delays the internal clock signal using the second delay device and allows the input signal to pass after maintaining the input signal for the predetermined period using the gating latch circuit, thereby generating the output signal, and
a delay amount provided by the second delay device is adjusted according to characteristics of the semiconductor memory device.

16. The method for controlling a semiconductor memory as claimed in claim 15, wherein:
when a plurality of gating latch circuits are provided, the plurality of gating latch circuits are connected in series for the input signal,
the plurality of gating latch circuits allow the input signal to pass at different respective time points,
the plurality of gating latch circuits comprise two gating latch circuits,
the adjustment circuit comprises the output clock driver for generating the internal clock signal, and the internal clock signal is used to control the passage and maintenance of the input signal in each of the plurality of gating latch circuits in response to the external clock signal, and
the method further comprises:
a first control step in which when the gating latch circuit on an upstream side of the plurality of gating latch circuits is controlled by the internal clock signal to cause the input signal to pass, the adjustment circuit controls the gating latch circuit on a downstream side of the plurality of gating latch circuits using the internal clock signal so that the input signal passing through the gating latch circuit on the upstream side is maintained; and
a second control step in which when the gating latch circuit on the upstream side is controlled by the internal clock signal to cause the input signal to be maintained, the adjustment circuit controls the gating latch circuit on the downstream side using the internal clock signal so that the input signal maintained in the gating latch circuit on the downstream side passes through.

* * * * *